(12) United States Patent
Lee et al.

(10) Patent No.: US 7,642,712 B2
(45) Date of Patent: Jan. 5, 2010

(54) DISPLAY DEVICE AND FABRICATING METHOD THEREOF

(75) Inventors: Dong-Won Lee, Seongnam-si (KR); Jianpu Wang, Yongin-si (KR); Jung-Soo Rhee, Seoul (KR); Jin-Koo Chung, Suwon-si (KR); Song-Mi Hong, Hwaseong-si (KR); Beohm-Rock Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 586 days.

(21) Appl. No.: 11/293,574

(22) Filed: Dec. 2, 2005

(65) Prior Publication Data

US 2006/0226771 A1    Oct. 12, 2006

(30) Foreign Application Priority Data

Apr. 12, 2005   (KR) .................... 10-2005-0030343

(51) Int. Cl.
*H01J 63/04*    (2006.01)
(52) U.S. Cl. ...................... 313/506; 313/504
(58) Field of Classification Search ........... 313/506, 313/512, 504; 445/24
See application file for complete search history.

(56) References Cited

U.S. PATENT DOCUMENTS

| | | | | |
|---|---|---|---|---|
| 5,061,040 A | * | 10/1991 | Yaniv et al. | 349/50 |
| 5,701,055 A | * | 12/1997 | Nagayama et al. | 313/504 |
| 6,035,180 A | * | 3/2000 | Kubes et al. | 455/575.1 |
| 6,326,936 B1 | * | 12/2001 | Inganas et al. | 345/55 |
| 6,369,495 B2 | * | 4/2002 | Codama et al. | 313/292 |
| 2007/0263164 A1 | * | 11/2007 | Kumagai | 349/156 |

* cited by examiner

*Primary Examiner*—Toan Ton
*Assistant Examiner*—Hana A Sanei
(74) *Attorney, Agent, or Firm*—Innovation Counsel LLP (57) ABSTRACT

A display device including a substrate, a first electrode formed over the substrate, and a partition member having a first aperture is provided. The display device further includes an emitting control layer covering a portion of the first aperture, thereby providing a second aperture to expose a portion of the first electrode, wherein the second aperture has a quadrangular shape with chamfered corners which help disperse organic material uniformly. Advantageously, the emitting control layer is formed of a material having an affinity to an organic material forming an organic light emitting layer within the second aperture, thereby helping to disperse the organic material uniformly and improve brightness uniformity.

28 Claims, 13 Drawing Sheets

DISPLAY DEVICE AND FABRICATING METHOD THEREOF

CROSS-REFERENCE TO RELATED APPLICATION

This application claims priority to Korean Patent Application No. 2005-030343 filed on, Apr. 12, 2005, the disclosure of which is hereby incorporated herein by reference in its entirety for all purposes.

BACKGROUND

1. Field of the Invention

The present invention relates generally to a display device, and in particular to an organic light emitting display (OLED) having a structure to improve display quality.

2. Description of Related Art

An organic light emitting display (OLED) is self-emissive and generally includes a plurality of pixels. Each pixel includes an anode, an organic light emitting layer, and a cathode. The organic light emitting layer includes an organic material having a low molecular weight or polymer. When a voltage is applied to the pixel, a positive charge from the anode is combined with a negative charge from the cathode to form excitons in the organic light emitting layer, and light is generated from the organic light emitting layer when holes are combined with electrons moving to a lower energy state.

Conventionally, a partition member is formed on the anode to cover edges of the anodes while exposing a portion of the anode via an aperture. Typically, the aperture has been a rectangular shape and the corners of the aperture have had right angles. The organic light emitting layer is formed by an ink jet method, in which an ink jet dispenses organic material through each aperture. The partition member holds the organic material in a specific pixel area and prevents organic material from diffusing to other pixels.

Organic material has a liquid phase which has the property of keeping surface tension energy as low as possible. Therefore, when organic material is dispensed onto the anode through the aperture, the organic material forms into a spherical shape to keep the surface tension energy low. Disadvantageously, organic material cannot fill (or wet) sharp corners (e.g., at right or acute angles) of the aperture exposing the anode. If the corners of the aperture are not completely filled (or wetted) with organic material, the organic light emitting layer does not have uniform thickness. Lack of thickness uniformity causes the brightness of the display (i.e., display luminance) to lack uniformity. Also, the anode and cathode may contact and cause a short circuit in the area where organic material cannot fill completely.

Accordingly, a display device with improved uniformity in the organic light emitting layer and a fabrication method thereof are highly desirable.

SUMMARY

According to one aspect of the present invention, a display device includes: a substrate; a first electrode formed over the substrate; a partition member having a first aperture; an emitting control layer covering a portion of the first aperture and providing a second aperture to expose a portion of the first electrode, wherein the second aperture has a quadrangular shape with chamfered corners; a light emitting layer formed within the second aperture; and a second electrode formed over the partition member, the emitting control layer, and the light emitting layer.

The emitting control layer extends from the edges or the corners of the partition member to cover a portion of the first aperture. The emitting control layer includes a material, such as silicon oxide, silicon nitride, amorphous silicon, or polysilicon, having an affinity to organic material for forming a light emitting layer. The emitting control layer may be formed under the partition member in one example.

The first aperture may have a quadrangular shape with chamfered corners or a substantially rectangular shape.

In one example, the chamfered length "b" of the second aperture is defined by the equation 5 $\mu m < b < a/2$, where "a" represents a length of the shortest side of the second aperture.

The method of manufacturing a display device includes: providing a substrate, a first electrode formed over the substrate, and a partition member having a first aperture; covering a portion of the first aperture with an emitting control layer to provide a second aperture exposing a portion of the first electrode, wherein the second aperture has a quadrangular shape with chamfered corners; forming a light emitting layer within the second aperture; and forming a second electrode over the partition member, the emitting control layer, and the light emitting layer.

BRIEF DESCRIPTION OF THE DRAWINGS

The features of the present invention will become more apparent to those of ordinary skill in the art by describing in detail exemplary embodiments thereof with reference to the attached drawings, in which.

Use of the same reference symbols in different figures indicates similar or identical items.

DETAILED DESCRIPTION

Figure 1:
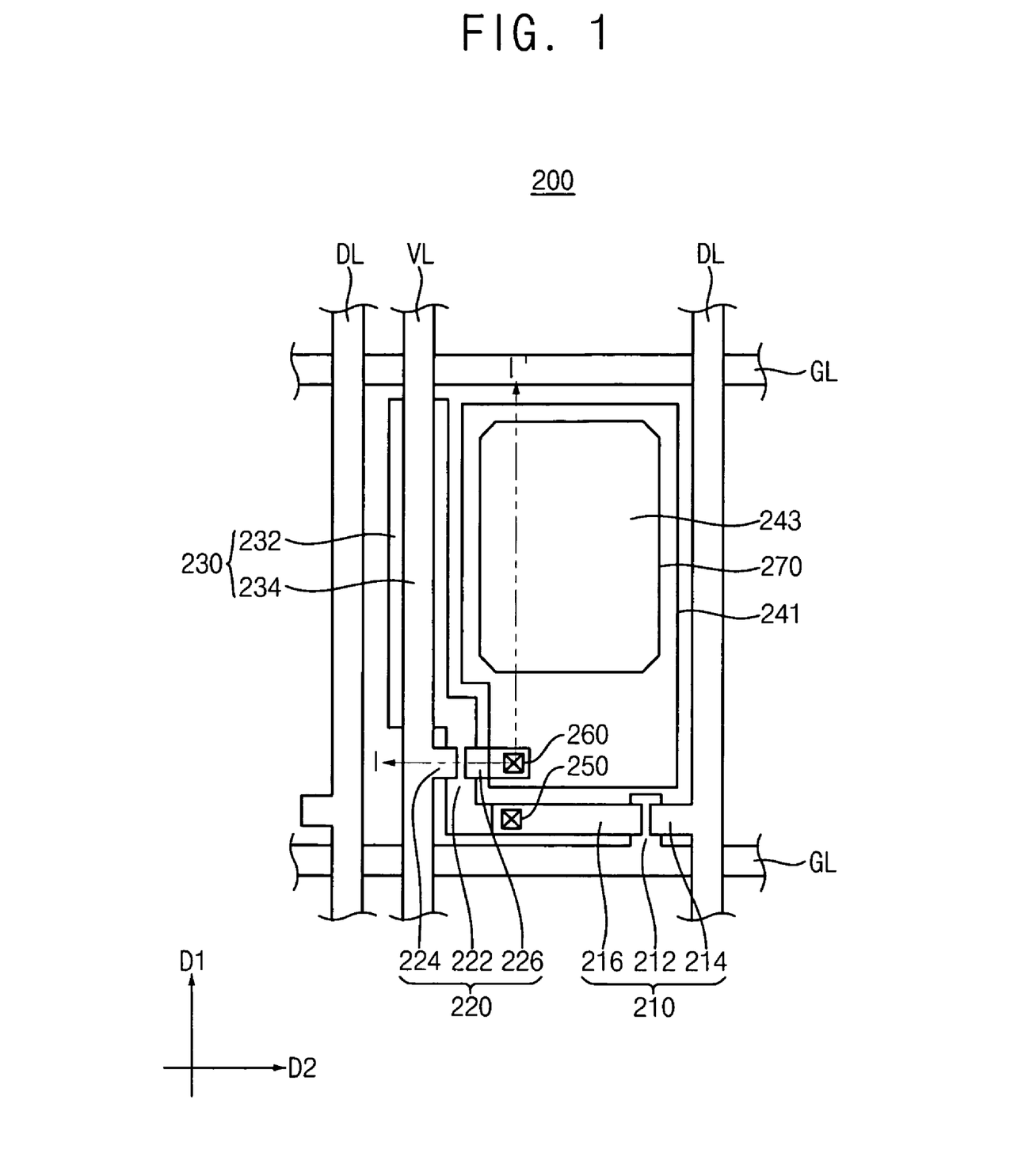
FIG. 1 is a plan view of an OLED according to an embodiment of the present invention.
Figure 2:
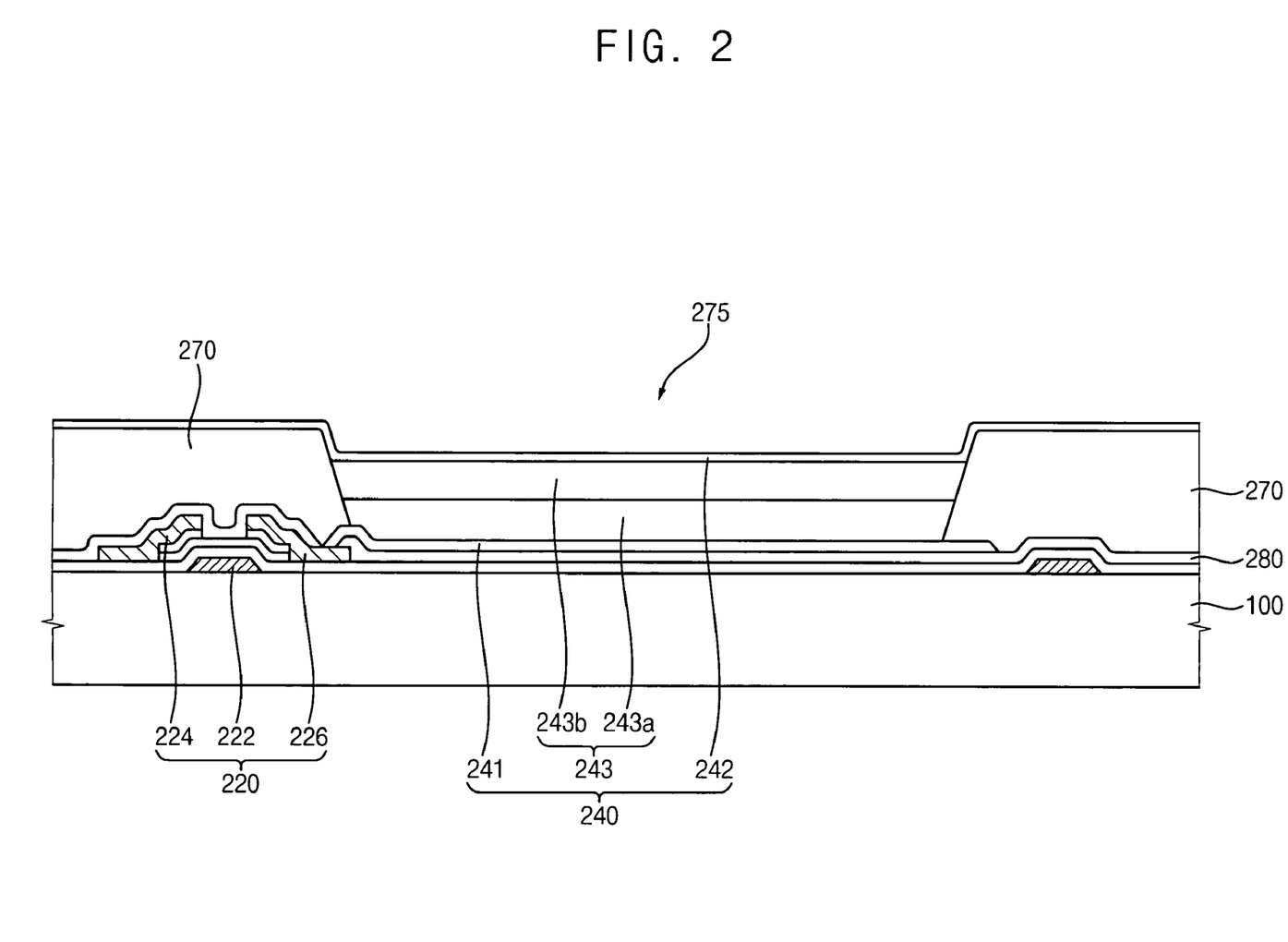
FIG. 2 is a cross-sectional view taken along the line I-I' of the OLED of FIG. 1.

FIG. 1 is a plan view of an OLED according to a first embodiment of the present invention, and FIG. 2 is a cross-sectional view taken along the line I-I' of FIG. 1.

Referring to FIGS. 1 and 2, the OLED includes a main substrate 100 and an organic light emitting element 200.

Main substrate 100 can include glass, triacetylcellulose (TAC), polycarbonate (PC), polyethersulfone (PES), polyethyleneterephthalate (PET), polyethylenenaphthalate (PEN), polyvinylalcohol (PVA), polymethylmethacrylate (PMMA), cyclo-olefin polymer (COP), or combinations thereof.

A plurality of data lines DL, a plurality of gate lines GL, and a plurality of power supply lines (voltage lines) VL are formed over main substrate 100. Data lines DL extend in a first direction D1 and each data line DL is arranged in parallel to and spaced apart from another data line DL along a second direction D2. Data lines DL transmit data signals. Gate lines GL extend in a second direction D2 and each gate line GL is arranged in parallel to another gate line GL along direction D1. Gate lines GL transmit gate signals. Power supply lines VL extend in first direction D1 and are arranged in parallel to data lines DL. Each power supply line is formed adjacent to each data line. Power supply lines VL transmit direct current signals Vdd. A pixel area is defined by two neighboring gate lines GL and data lines DL, with multiple pixel regions being arranged in a matrix configuration.

The organic light emitting element 200 is formed in a pixel area over main substrate 100. Organic light emitting element 200 includes a switching transistor 210, a current control transistor 220, a storage capacitor 230, and an organic light emitting diode 240. A plurality of organic light emitting elements 200 is arranged in a matrix over the main substrate.

Switching transistor 210 includes a first gate electrode 212, a first source electrode 214, and a first drain electrode 216. First gate electrode 212 is electrically connected to one of the gate lines GL to receive a gate signal from a driving circuit (not shown). First source electrode 214 is electrically connected to data line DL to receive a data signal from a driving circuit (not shown). First drain electrode 216 is spaced apart from first source electrode 214.

Current control transistor 220 includes a second gate electrode 222, a second source electrode 224, and a drain electrode 226. Second gate electrode 222 is electrically connected to first drain electrode 216 of switching transistor 210 through a first contact hole 250. Second source electrode 224 is electrically connected to power supply line VL and receives direct current signal (driving voltage) Vdd from power supply line VL. Second drain electrode 226 is spaced apart from second source electrode 224.

Storage capacitor 230 includes a first electrode 232 and a second electrode 234. First electrode 232 is electrically connected to second gate electrode 222, and second electrode 234 is electrically connected to power supply line VL. Storage capacitor 230 stores and maintains a voltage difference between second gate electrode 222 and power supply line VL during a determined display period (e.g., one frame).

Organic light emitting diode 240 includes an anode 241, a cathode 242, and an organic light emitting layer 243. Organic light emitting layer 243 includes a hole injection layer (positive charge carrier injection layer) 243a and an emitting layer 243b formed on hole injection layer 243a. The hole injection layer may also be called a hole transporting layer. In other embodiments, hole injection layer 243a may be omitted.

Anode 241 is electrically connected to second drain electrode 226 of current control transistor 220 through a second contact hole 260 and receives a driving current from power supply line VL. In one example, anode 241 is formed of a transparent conductive material, such as indium tin oxide (ITO) or indium zinc oxide (IZO), and within the pixel area defined by data line DL and gate line GL. In this embodiment, anode 241 is substantially rectangular (quadrangular) in shape.

Organic light emitting layer 243 includes an organic material having a low molecular weight or a polymer. Organic light emitting layer 243 may include an emitting layer 243b which emits red, green, or blue light. Organic light emitting layer 243 is interposed between anode 241 and cathode 242.

A partition member 270 is formed on anode 241 and an inorganic insulating layer 280. Partition member 270 has a first aperture 275 which exposes a portion of anode 241 and insulates anodes from each other. An organic or inorganic layer may be patterned to form partition member 270. For example, an organic layer is formed on anode 241 and inorganic insulating layer 280, and then the organic layer is patterned to form partition member 270 and to expose interior portions of anode 241 via first aperture 275. Partition member 270 holds a droplet (not shown) in first aperture 275 until the droplet is dried to form organic light emitting layer 243.

Cathode 242 is formed over partition member 270 and organic light emitting layer 243, and a common voltage is applied to cathode 242. In one example, cathode 242 is formed of calcium (Ca), barium (Ba), silver (Ag), copper (Cu), aluminum (Al), magnesium (Mg), or alloys thereof.

Figure 3:
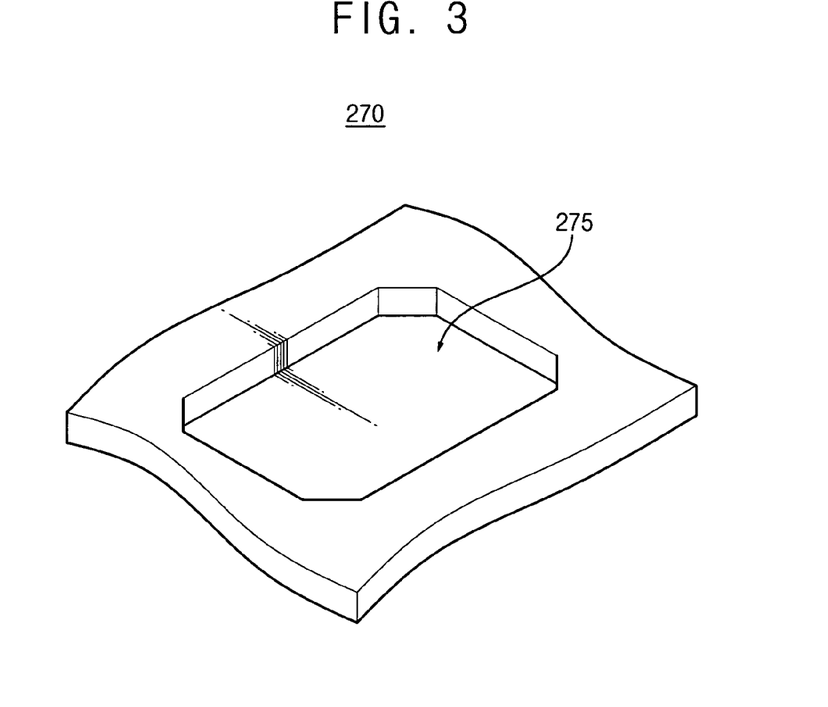
FIG. 3 is a perspective view of a partition member shown in FIGS. 1 and 2.
Figure 4:
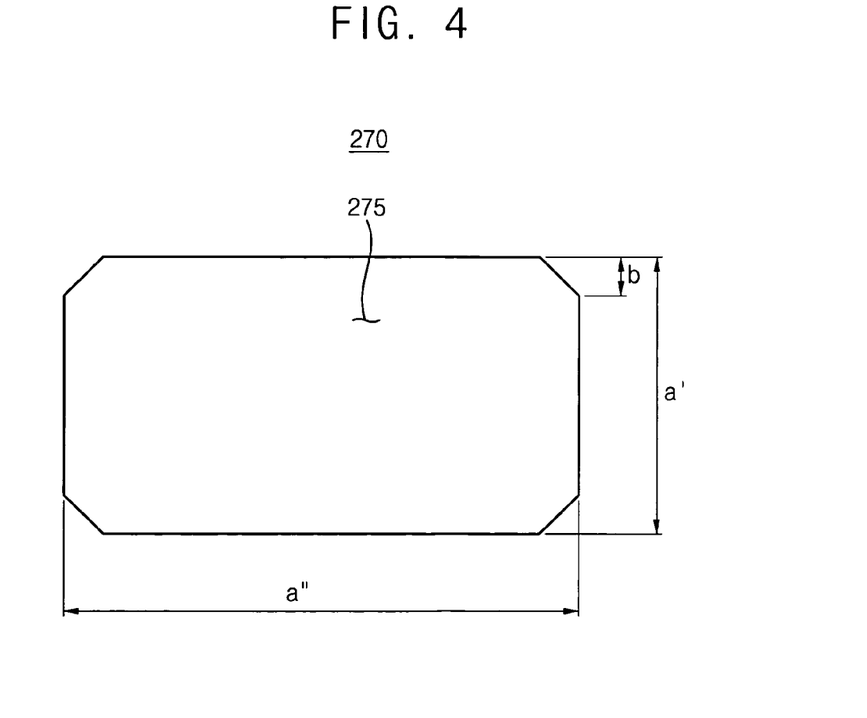
FIG. 4 is a plan view of the partition member shown in FIG. 3.

Referring now to FIGS. 3 and 4, a perspective view and a plan view, respectively, of a portion of partition member 270 in FIGS. 1 and 2 are shown.

According to FIGS. 3 and 4, first aperture 275 of partition member 270 has a quadrangular shape with chamfered corners (e.g., all of the corners include an obtuse angle vertex).

In one example, chamfered length b satisfies equation 1 below.

$$w < b < a/2, \quad (1)$$

where "w" is a predetermined length and "a" is the length of the shortest side of first aperture 275. For example, "a" is a shorter one of longitudinal length a' and latitudinal length a". In one example, "w" is about 5 μm, and thus chamfered length "b" is greater than 5 μm and less than a half of the shorter side (either a' or a") of first aperture 275. In another example, the longitudinal length "a" of aperture 275 is greater than about 10 μm, and the chamfered length "b" of aperture 275 is greater than about 5 μm.

Chamfered length "b" depends on various factors, including but not limited to gravity which influences a droplet of organic material dispensed within aperture 275, size of the organic material droplet, surface roughness of partition member 270, and a difference between a surface energy of the droplet and a surface energy where the organic material droplet is dispensed.

Organic material is dispensed by ink jet within aperture 275 of partition member 270 and is dried so that organic light emitting layer 243 is formed. Advantageously, the shape of first aperture 275 allows organic material droplets to disperse uniformly to all corners of first aperture 275, causing organic light emitting layer 243 and first aperture 275 to have substantially the same shape with substantially the same lengths. Thus, a light emitting area of OLED has the quadrangular shape with chamfered corners having no acute angular vertex. Accordingly, uniformity of brightness (luminance) is increased and an opening ratio of first aperture 275 may also be increased.

Figure 5:
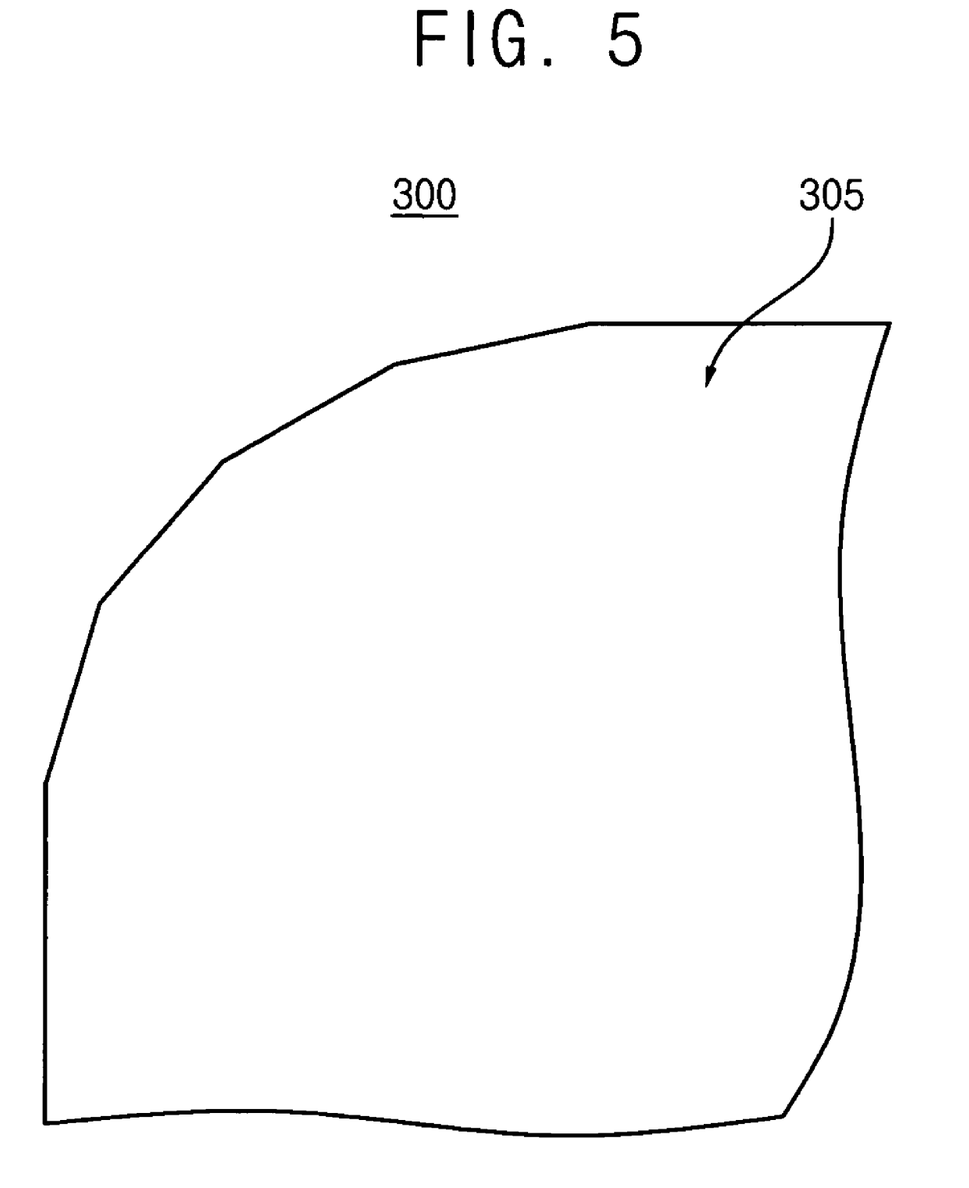
FIG. 5 is a partial plan view showing another corner shape of the partition member from FIG. 4 according to another embodiment of the present invention.

FIG. 5 is a partial plan view of a modified partition member aperture in accordance with another embodiment of the present invention. Partition member 300 has an aperture 305, with each of the corners being chamfered in a polygonal shape. As compared with aperture 275 shown in FIG. 3, each of the corners of aperture 305 has four surfaces instead of one and is more similar in shape to a curve. More or less chamfered corner surfaces may be used.

Although the present invention has been described with reference to an OLED, the invention is not so limited and can be applied to various display devices including a partition member, such as liquid crystal displays (LCDs) or plasma panel displays (PDPs).

Figure 6:
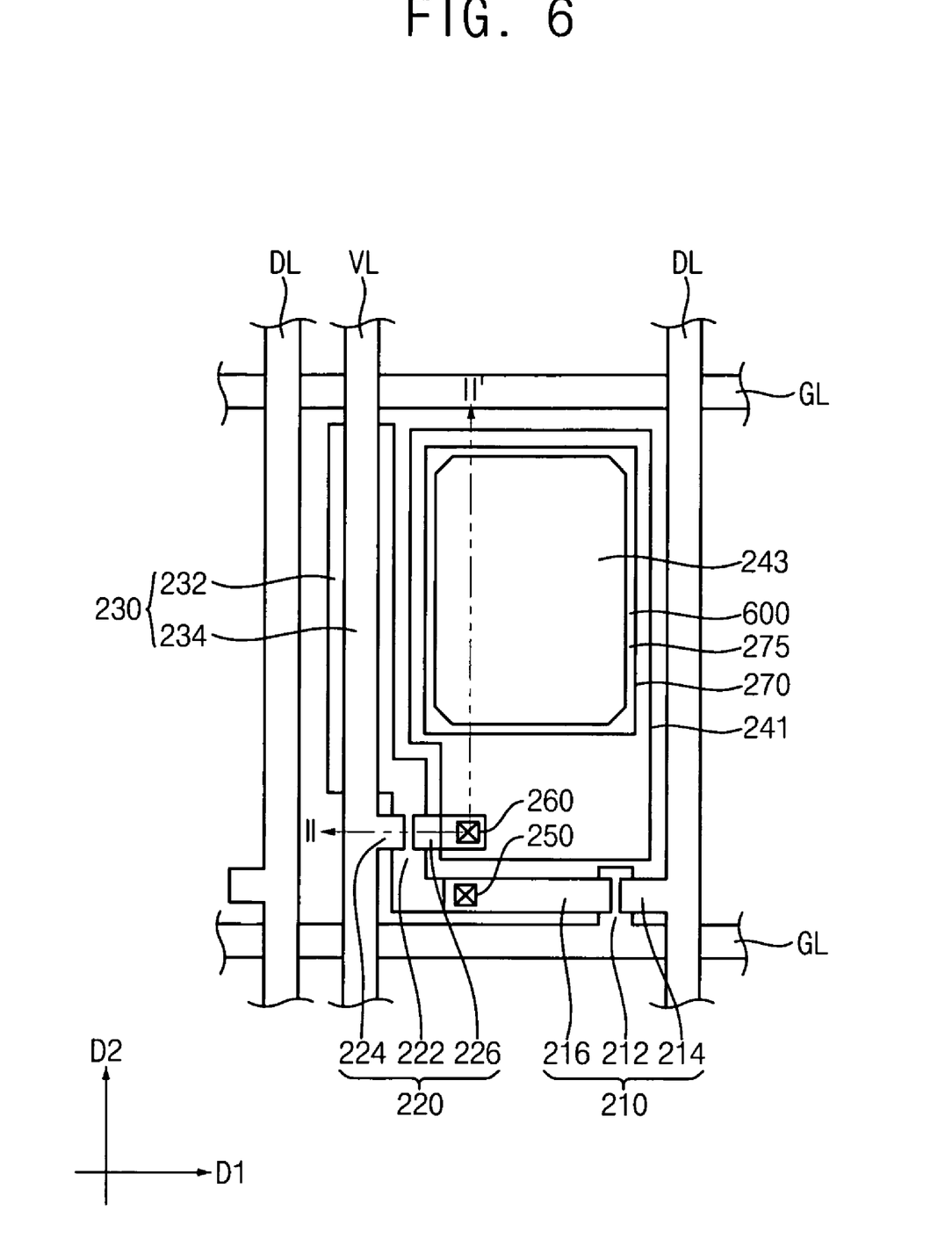
FIG. 6 is a plan view of an OLED according to another embodiment of the present invention.
Figure 7:
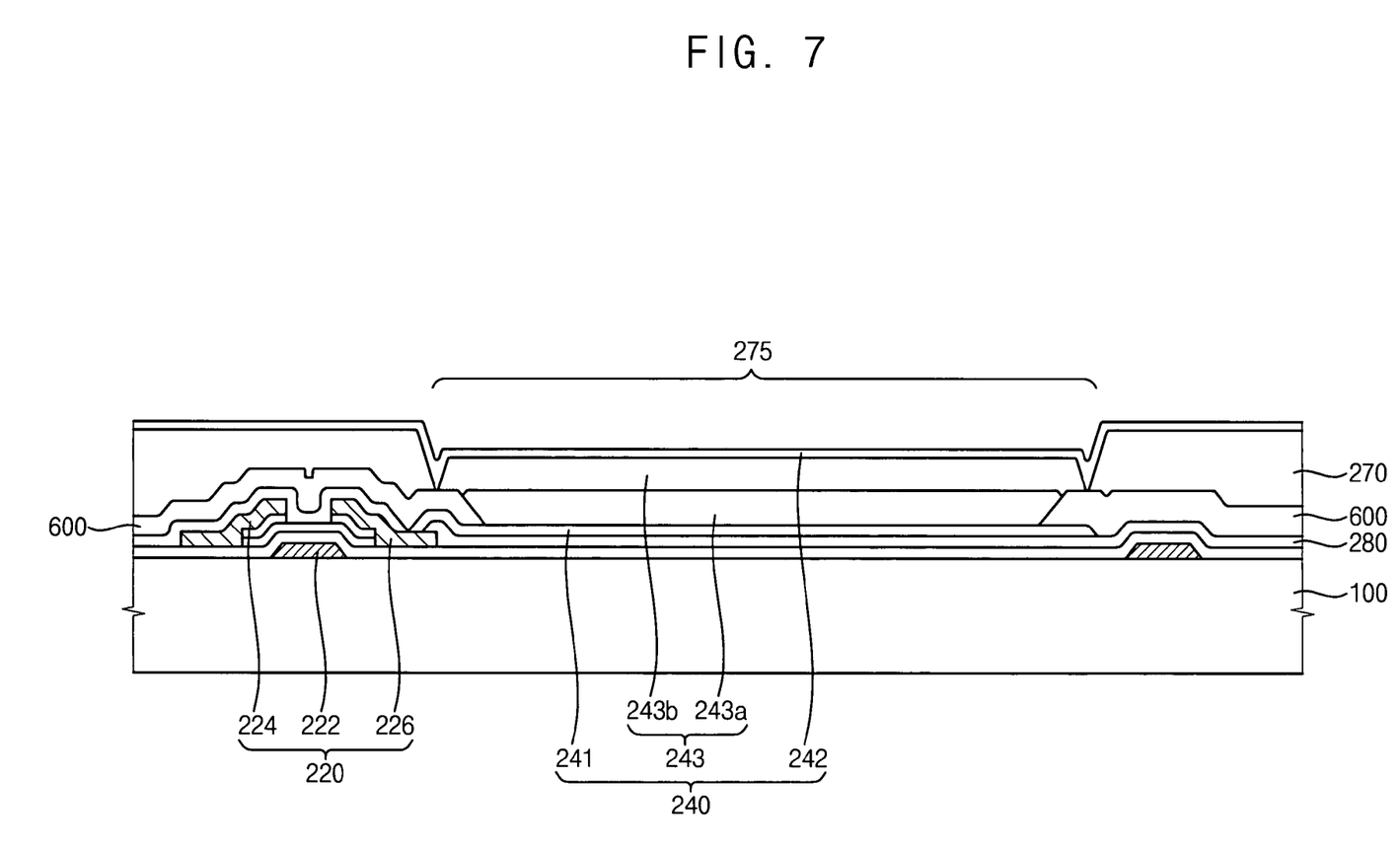
FIG. 7 is a cross-sectional view taken along the line II-II' of the OLED of FIG. 6.
Figure 8:
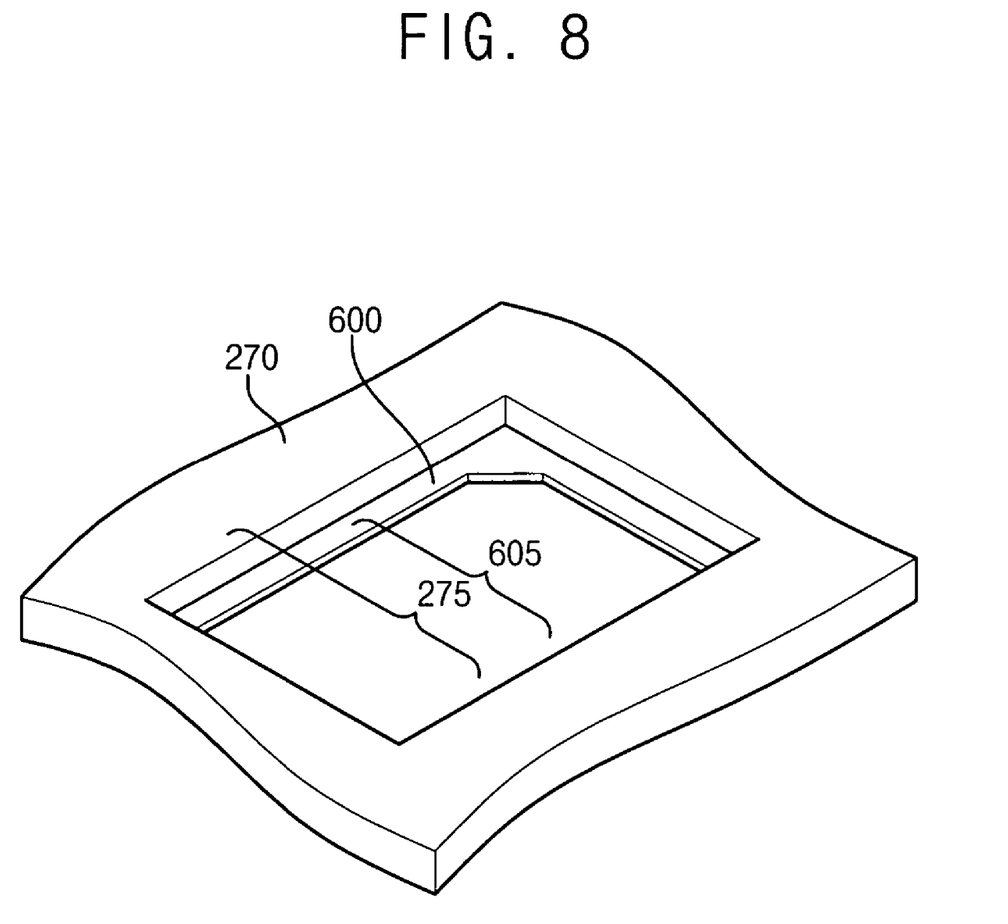
FIG. 8 is a perspective view showing a partition member of FIGS. 6 and 7.

FIG. 6 is a plan view of an OLED according to another embodiment of the present invention, and FIG. 7 is a cross-sectional view taken along the line II-II' of FIG. 6. FIG. 8 shows a perspective view of a partition member shown in FIGS. 6 and 7. Elements shown in this embodiment are substantially similar to elements shown in the first embodiment except for the addition of an emitting control layer 600. Thus, like numerals refer to like elements as described above with respect to FIGS. 1 to 4 and further explanation of the like elements will be omitted.

Referring to FIGS. 6, 7, and 8, an OLED includes a main substrate 100 and an organic light emitting element 200 over main substrate 100.

Organic light emitting element 200 includes a switching transistor 210, a current control transistor 220, a storage capacitor 230, and an organic light emitting diode 240. Organic light emitting diode 240 includes an anode 241, a cathode 242, and an organic light emitting layer 243. Organic light emitting layer 243 is surrounded by a partition member 270 and emitting control layer 600.

Partition member 270 is formed over an inorganic insulating layer 280 and anode 241 and has a first aperture 275 to expose a portion of anode 241 and portions of emitting control layer 600. In one example, an organic material is coated on anode 241 and emitting control layer 600 and partially removed to form partition member 270 with first aperture 275. First aperture 275 of partition member 270 is substantially rectangular in shape.

Emitting control layer 600 is disposed between partition member 270 and inorganic insulating layer 280 to partially cover or pattern first aperture 275. Emitting control layer 600 includes a material having an affinity to organic material forming organic light emitting layer 243. For example, emitting control layer 600 is formed of a silicon oxide ($SiO_2$), a silicon nitride ($Si_3N_4$), amorphous silicon, or polysilicon.

Referring to FIG. 8, emitting control layer 600 extends from edges of partition member 270 towards a center of first aperture 275 by a constant width, thus providing a second aperture 605 to expose interior portions of anode 241. The second aperture 605 has a quadrangular shape with chamfered corners (e.g., the corners have no acute angular vertex). In one example, the chamfered length "b" is greater than about 5 μm and less than a half of the shortest length of second aperture 605 in accordance with equation 1. The chamfered length "b" depends on various factors, including but not limited to gravity which influences a droplet of organic material dispensed within aperture 605, size of the organic material droplet, surface roughness of partition member 600, and a difference between a surface energy of the droplet and a surface energy where the organic material droplet is dispensed.

Organic material is dispensed by ink jet within first aperture 275 and second aperture 605 surrounded by partition member 270 and emitting control layer 600, respectively. Affinity of emitting control layer 600 to organic material causes the dispensed organic material to disperse uniformly at or wet the corners of partition member 270.

Also, emitting control layer 600 extends from edges of partition member 270 so that emitting control layer 600 covers portions of first aperture 275. Thus, emitting control layer 600 prevents light emission from edges of organic light emitting layer 243 adjacent to the edges of partition member 270. Accordingly, even though an edge portion of organic light emitting layer 243 lacks a uniform thickness, emitting control layer 600 can prevent light emission from the non-uniform area(s) to improve brightness uniformity and display quality.

Figure 9:
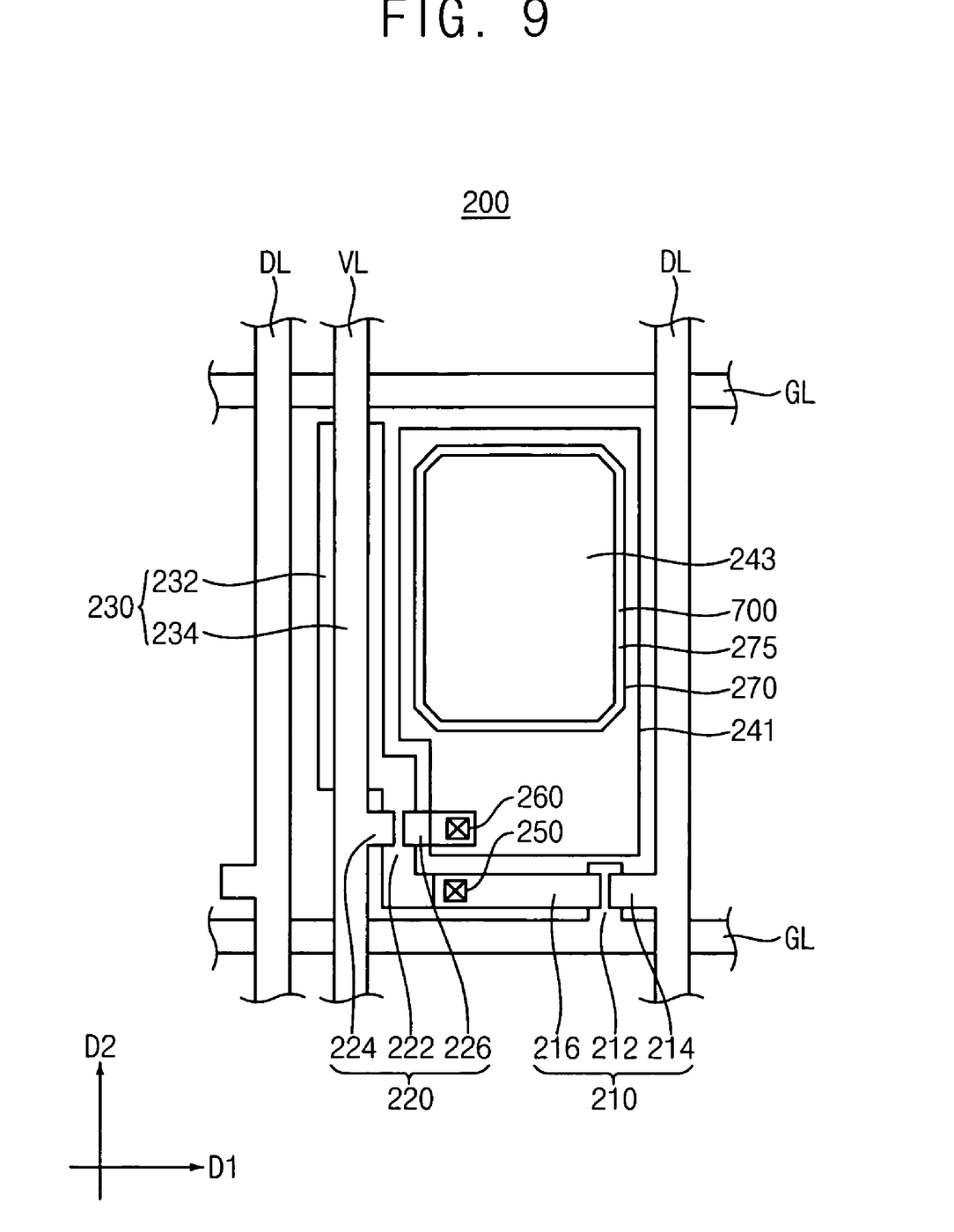
FIG. 9 is a plan view of an OLED according to yet another embodiment of the present invention.
Figure 10:
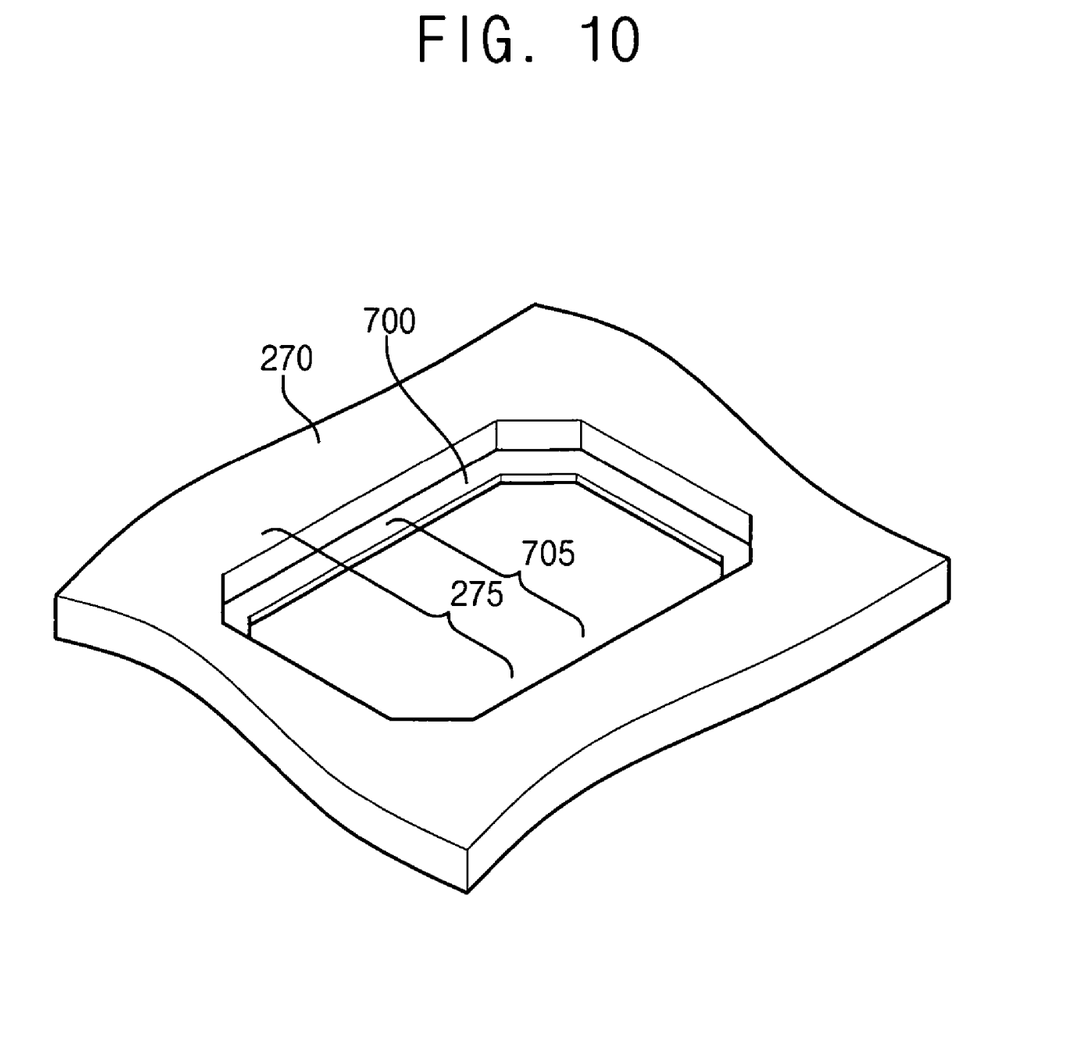
FIG. 10 is a perspective view showing a partition member of FIG. 9.

FIG. 9 is a plan view of an OLED according to yet another embodiment of the present invention, and FIG. 10 is a perspective view of a partition member shown in FIG. 9.

Elements shown in this embodiment are substantially similar to elements shown in the embodiment described above with respect to FIGS. 6 to 8 except for the shape of a first aperture 275 of partition member 270. Thus, like numerals refer to like elements as described above with respect to FIGS. 6 to 8 and further explanation of the like elements will be omitted.

According to FIGS. 9 and 10, the OLED includes a main substrate 100 and an organic light emitting element 200 over main substrate 100.

Organic light emitting element 200 includes a switching transistor 210, a current control transistor 220, a storage capacitor 230, and an organic light emitting diode 240. Organic light emitting diode 240 includes an anode, a cathode, and organic light emitting layer 243. Organic light emitting layer 243 is surrounded by a partition member 270 and an emitting control layer 700.

Partition member 270 is formed over an inorganic insulating layer (similar to inorganic insulating layer 280 of FIG. 7) and anode 241 and has a first aperture 275 to expose interior portions of anode 241 and portions of emitting control layer 700. First aperture 275 has a quadrangular shape with chamfered corners (e.g., all of the corners include an obtuse angle vertex).

Emitting control layer 700 extends from edges of partition member 270 by a constant width and covers portions of first aperture 275. Emitting control layer 700 is disposed between partition member 270 and the inorganic insulating layer. Emitting control layer 700 has a second aperture 705 to expose interior portions of anode 241. Second aperture 705 also has a quadrangular shape with chamfered corners (e.g., all of the corners include an obtuse angle vertex), and in one example has substantially the same shape as first aperture 275. The chamfered length "b" is greater than about 5 μm and less than a half of the shortest length of second aperture 705 in accordance with equation 1 above.

Emitting control layer 700 is formed of a material having affinity to organic material for forming organic light emitting layer 243. Organic material is dispensed by ink jet in first aperture 275 defined by partition member 270 and second aperture 705 defined by emitting control layer 700. The organic material affinity of emitting control layer 700 helps to disperse organic material uniformly at the edges and corners of partition member 270.

Also, emitting control layer 700 extends from edges of partition member 275 and prevents a light emission from organic light emitting layer 243 adjacent to edge of partition member 270. Accordingly, even though organic light emitting layer 243 lacks a uniform thickness at edges of partition member 270, emitting control layer 700 blocks a light emitted from the non-uniform areas to improve brightness uniformity and display quality.

Figure 11:
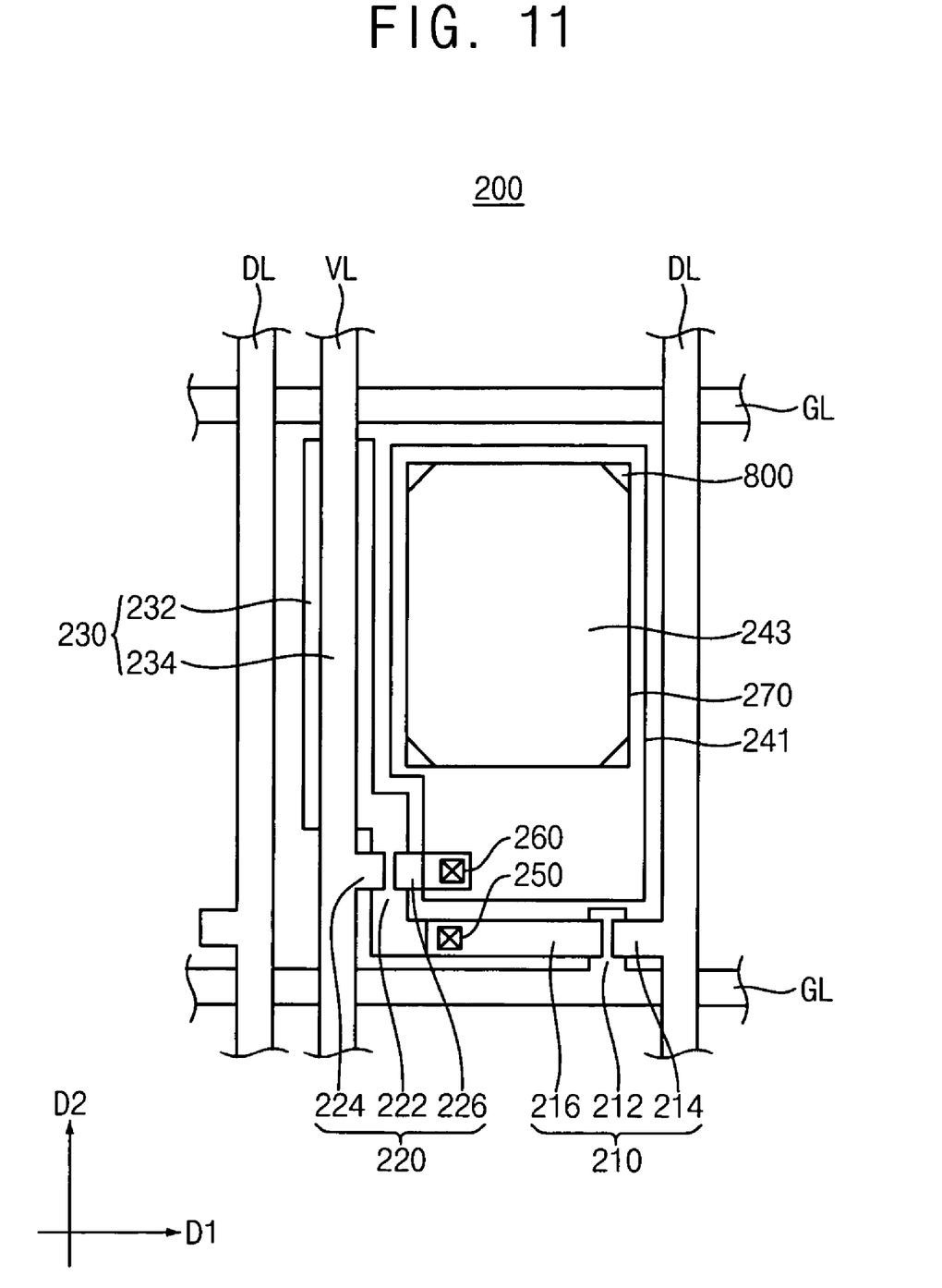
FIG. 11 is a plan view of an OLED according to yet another embodiment of the present invention.
Figure 12:
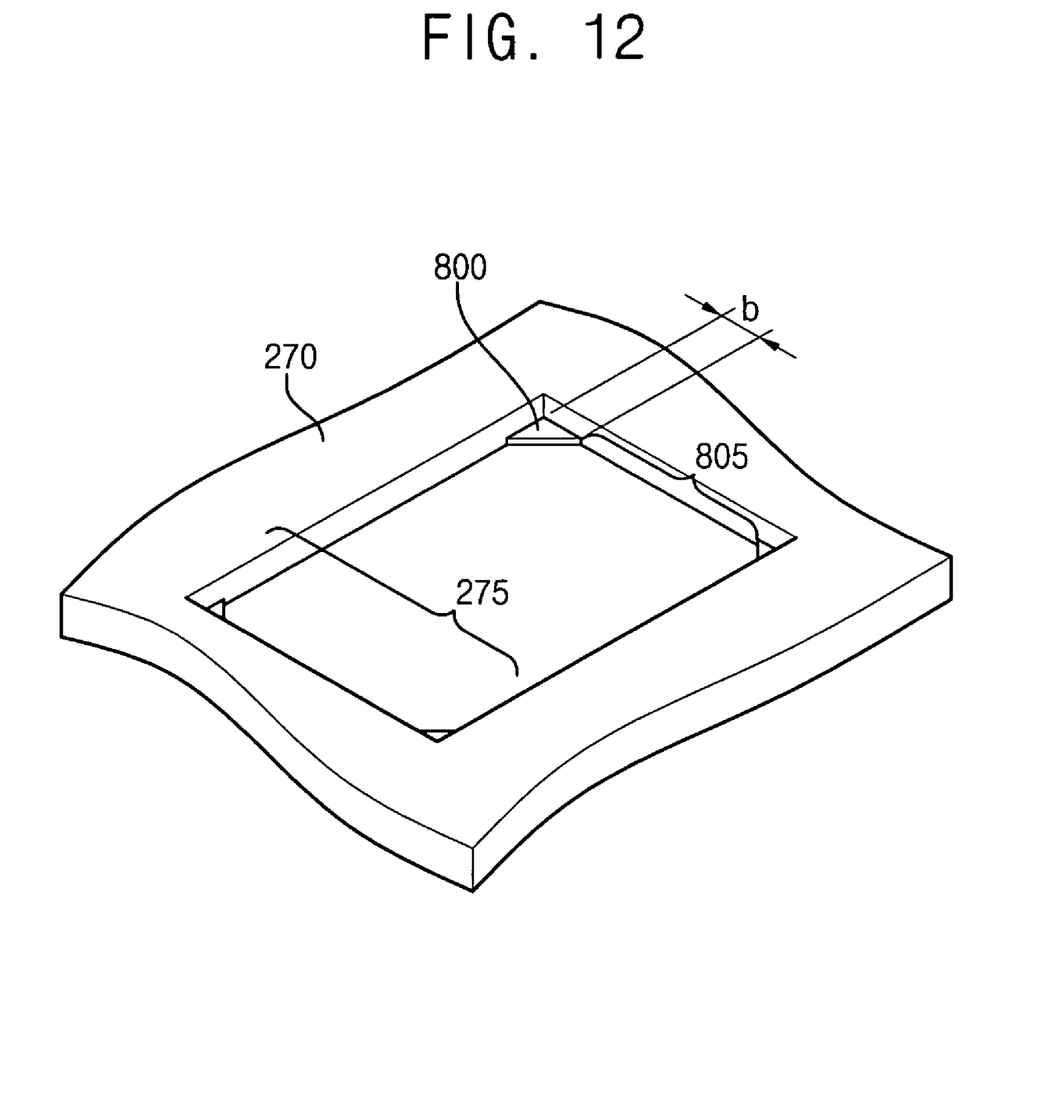
FIG. 12 is a perspective view showing a partition member of FIG. 11.

FIG. 11 is a plan view of an OLED according to yet another embodiment of the present invention, and FIG. 12 is a perspective view of a partition member shown in FIG. 11. Elements shown in this embodiment are substantially similar to elements shown in the embodiment described above with respect to FIGS. 1 to 4 except for an emitting control layer 800. Thus, like numerals refer to like elements as described above with respect to FIGS. 1 to 4 and further explanation of the like elements will be omitted.

Referring to FIGS. 11 and 12, the OLED of this embodiment includes a main substrate 100 and an organic light emitting element 200.

Organic light emitting element 200 includes a switching transistor 210, a current control transistor 220, a storage capacitor 230, and an organic light emitting diode 240. Organic light emitting diode 240 includes an anode 241, a cathode similar to cathode 242 of FIG. 7, and organic light emitting layer 243. Organic light emitting layer 243 is surrounded by a partition member 270 and an emitting control layer 800.

Partition member 270 is formed over an anode and includes a first aperture 275 which is substantially rectangular in shape to expose interior portions of the anode and portions of emitting control layer 800.

Emitting control layer 800 extends from the four corners of first aperture 275 and has a triangle shape. A "b" length of the triangle shape is between about 5 μm and a half of the longitudinal length of first aperture 275. Accordingly, emitting control layer 800 covers portions of first aperture 275, such that first aperture 275 in combination with emitting control layer 800 forms a second aperture 805 having a substantially quadrangular shape with chamfered-like corners. Emitting control layer 800 is formed of a material having an affinity to organic material for forming organic light emitting layer 243.

Organic material is dispensed in first aperture 275 and second aperture 805 and dries to form organic light emitting layer 243. Affinity of emitting control layer 800 to organic material helps to disperse organic material uniformly to form a uniform surface of organic light emitting layer 243.

Organic light emitting layer 243 has a quadrangular shape with chamfered corners. Even though organic light emitting layer 243 at edge of partition member 270 may have a non-uniform thickness, emitting control layer 800 blocks light emitted from edges of organic light emitting layer 243 to improve brightness uniformity and display quality.

Figure 13:
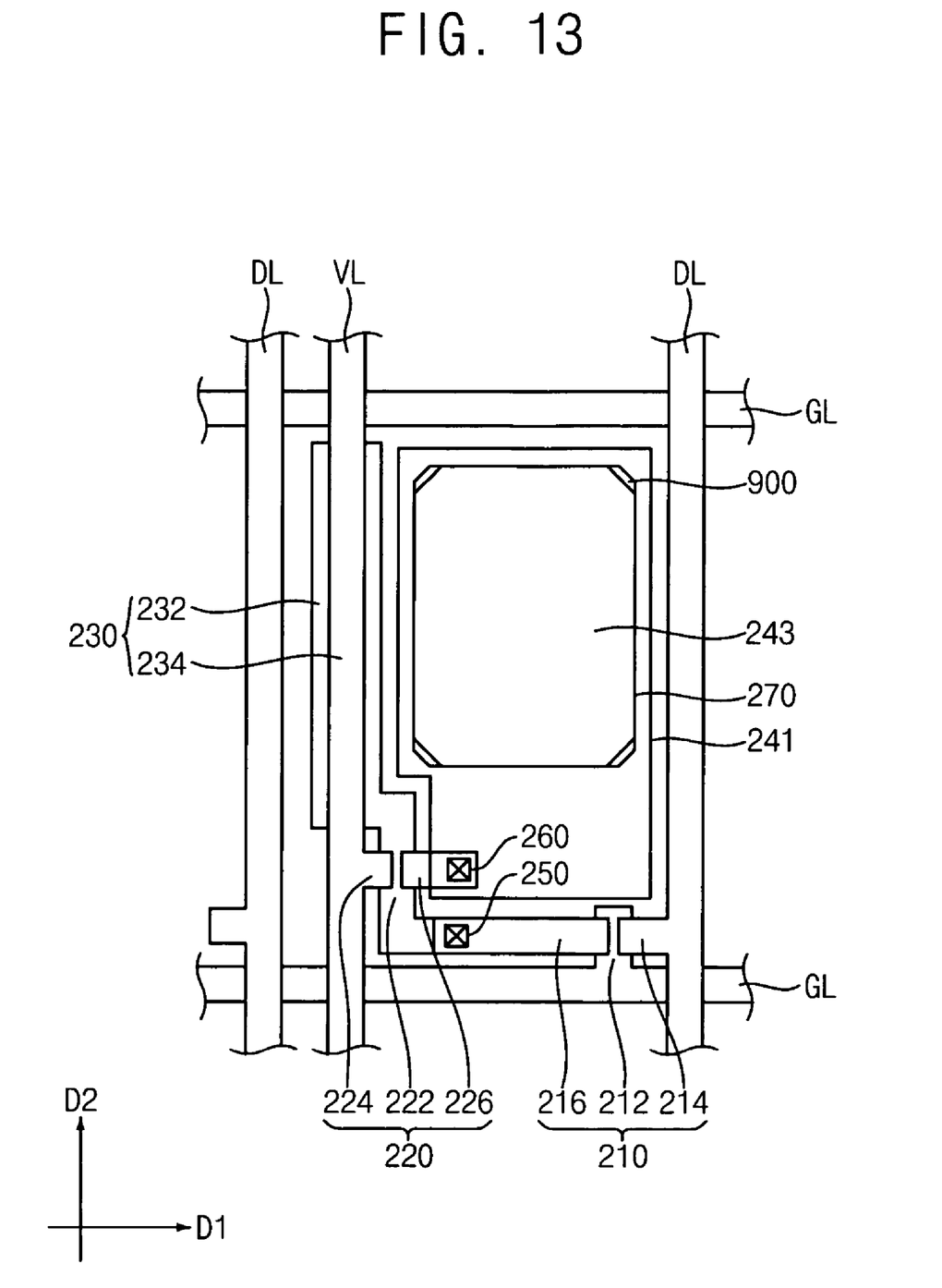
FIG. 13 is a plan view of an OLED according to yet another embodiment of the present invention.
Figure 14:
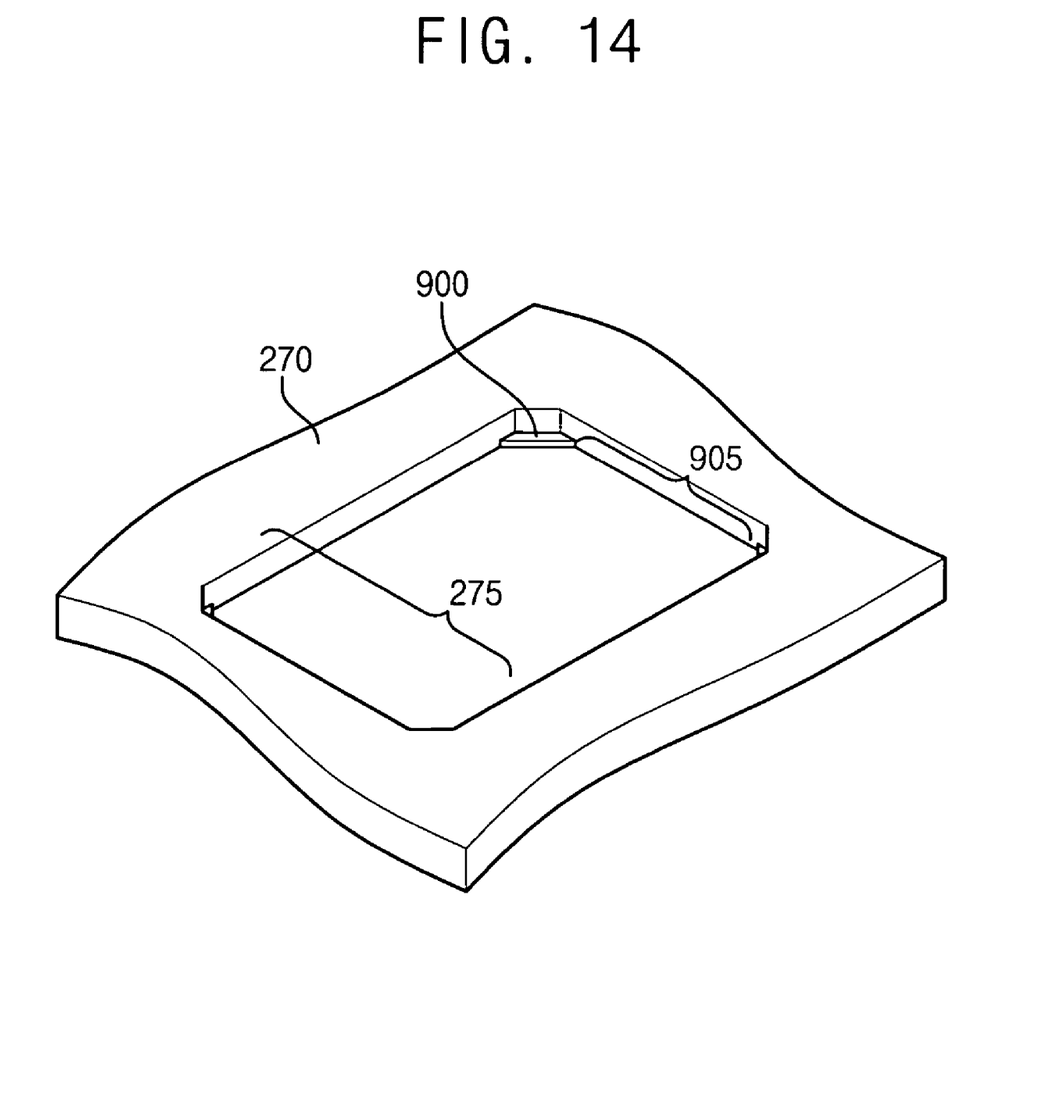
FIG. 14 is a perspective view showing a partition member of FIG. 13.

FIG. 13 is a plan view of OLED according to yet another embodiment of the present invention, and FIG. 14 is a perspective view of a partition member shown in FIG. 13.

Elements shown in this embodiment are substantially similar to elements shown in the embodiment described above with respect to FIGS. 11 to 12 except for a shape of partition member 270. Thus, like numerals refer to like elements as described above with respect to FIGS. 11 to 12 and further explanation of the like elements will be omitted.

Referring to FIGS. 13 and 14, a partition member 270 has a first aperture 275 to expose interior portions of anode 241. First aperture 275 has a guadrangular shape with chamfered corners. An emitting control layer 900 extends from corners of first aperture 275 defined by partition member 270 and covers a portion of first aperture 275 to form a second aperture 905. Emitting control layer 900 is formed of a material having an affinity to organic material for forming organic light emitting layer 243.

Organic material is dispensed in first aperture 275 and second aperture 905 and dried to form organic light emitting layer 243. Affinity of emitting control layer 900 to organic material helps to disperse organic material uniformly and form a uniform surface of organic light emitting layer 243.

Also, a light emitting area of OLED according to the present embodiment has a quadrangular shape with chamfered corners. Even though organic light emitting layer 243 at edges of second aperture 905 (light emitting area) has a non-uniform thickness, emitting control layer 900 blocks light emitted from edges of organic light emitting layer 243 to improve a brightness uniformity and display quality.

Although the invention has been described with reference to particular embodiments, the description is an example of the invention's application and should not be taken as a limitation. Various adaptations and combinations of the features of the embodiments disclosed are within the scope of the invention as defined by the following claims.

What is claimed is:

1. A display device, comprising:
   a substrate;
   a first electrode formed over the substrate;
   a partition member having a first aperture;
   an emitting control layer covering a portion of the first aperture and providing a second aperture to expose a portion of the first electrode, wherein the second aperture has a quadrangular shape with chamfered corners;
   an organic light emitting layer formed within the second aperture and directly contacting the emitting control layer; and
   a second electrode formed over the partition member, the emitting control layer, and the light emitting layer.

2. The display device of claim 1, wherein the emitting control layer extends from the edges of the partition member to cover a portion of the first aperture.

3. The display device of claim 1, wherein the first aperture has a quadrangular shape with chamfered corners including only obtuse angular vertices.

4. The display device of claim 1, wherein the first aperture has a substantially rectangular shape.

5. The display device of claim 1, wherein the emitting control layer extends from the corners of the first aperture.

6. The display device of claim 5, wherein the first aperture has a rectangular shape.

7. The display device of claim 6, wherein the emitting control layer has a triangular shape.

8. The display device of claim 5, wherein the first aperture has a quadrangular shape with chamfered corners.

9. The display device of claim 8, wherein the emitting control layer has a trapezoid shape.

10. The display device of claim 1, wherein the organic light emitting layer includes an organic material having a low molecular weight or polymer.

11. The display device of claim 1, wherein the partition member is formed over the first electrode and an insulating layer.

12. The display device of claim 1, wherein the emitting control layer is formed under the partition member.

13. The display device of claim 11, wherein the emitting control layer is formed between the partition member and the insulating layer formed over the substrate.

14. The display device of claim 1, wherein the emitting control layer includes a material having an affinity to organic material.

15. The display device of claim 1, wherein the emitting control layer is formed of silicon oxide, silicon nitride, amorphous silicon, polysilicon, or a combination thereof.

16. The display device of claim 1, wherein a chamfered length "b" of the second aperture is defined by the equation $5\mu m < b < a/2$, where "a" represents a shortest length of the second aperture.

17. The display device of claim 1, wherein the circumference of an edge of the second aperture nearest to the substrate is smaller than the circumference of an edge of the first aperture nearest to the substrate.

18. A display device, comprising:
   a substrate;
   a first electrode formed over the substrate;
   a partition member having a first aperture to expose a portion of the first electrode;
   an emitting control layer covering a portion of the first aperture and providing a second aperture to expose a portion of the first electrode, wherein the second has a quadrangular shape with chamfered corners, and further wherein the emitting control layer includes a material having an affinity to organic material;
   an organic light emitting layer formed within the second aperture and directly contacting the emitting control layer; and
   a second electrode formed over the partition member, the emitting control layer, and the light emitting layer.

19. The display device of claim 18, wherein the first aperture has a quadrangular shape with chamfered corners including only obtuse angular vertices.

20. The display device of claim 18, wherein the first aperture has a shape selected from the group consisting of a rectangle and a quadrangular shape with chamfered corners.

21. The display device of claim 18, wherein the emitting control layer has a shape selected from the group consisting of a triangle and a trapezoid.

22. The display device of claim 18, wherein the light emitting layer includes an organic material having a low molecular weight or polymer.

23. The display device of claim 18, wherein the partition member is formed over the first electrode and an insulating layer.

24. The display device of claim 23, wherein the emitting control layer is formed between the partition member and the insulating layer formed over the substrate.

25. The display device of claim 18, wherein the emitting control layer is formed under the partition member.

26. The display device of claim 18, wherein the emitting control layer is formed of silicon oxide, silicon nitride, amorphous silicon, polysilicon, or a combination thereof.

27. The display device of claim 18, wherein a chamfered length "b" of the second aperture is defined by the equation $5\mu m < b < a/2$, where "a" represents a shortest length of the second aperture.

28. A method of manufacturing a display device, the method comprising:
   providing a substrate, a first electrode formed over the substrate, and a partition member having a first aperture;
   covering a portion of the first aperture with an emitting control layer to provide a second aperture exposing a portion of the first electrode, wherein the second aperture has a quadrangular shape with chamfered corners;
   forming an organic light emitting layer within the second aperture and directly contacting the emitting control layer; and
   forming a second electrode over the partition member, the emitting control layer, and the light emitting layer.

* * * * *